Dec. 31, 1968 M. P. XYLANDER 3,419,810

TEMPERATURE COMPENSATED AMPLIFIER WITH AMPLITUDE DISCRIMINATION

Filed April 7, 1967 Sheet 1 of 2

INVENTOR

MELVIN P. XYLANDER

BY [signature]

AGENT

| T | | COLLECTOR 20c | EMITTER 25e | COLLECTOR CURRENT 25c | $h_{fe}$ | hib | Ag |
|---|---|---|---|---|---|---|---|
| -55°C | (218°) | +2.1V | +1.2V | 1.5ma | 30 | 25.0Ω | 0.0193 ℧ |
| +25°C | (298°) | +2.3V | +1.6V | 2.0ma | 70 | 25.6Ω | 0.0193 ℧ |
| +125°C | (398°) | +2.5V | +2.0V | 2.5ma | 140 | 27.4Ω | 0.0183 ℧ |
FIG. 3b
$$hib_1 = hib_2 = \frac{KT}{qI_E} = \frac{0.86 \times 10^{-4} \times 218}{0.75 \times 10^{-3}} = 25.0\Omega$$
$$A_g = \frac{I_{out}}{E_{in}} = \left(\frac{1}{hib_1 + hib_2}\right)\left(\frac{h_{fe}}{h_{fe}+1}\right)$$
$$A_g = \left(\frac{1}{50}\right)\left(\frac{30}{31}\right) = 0.0193 \text{ ℧ mhos}$$
FIG. 3c
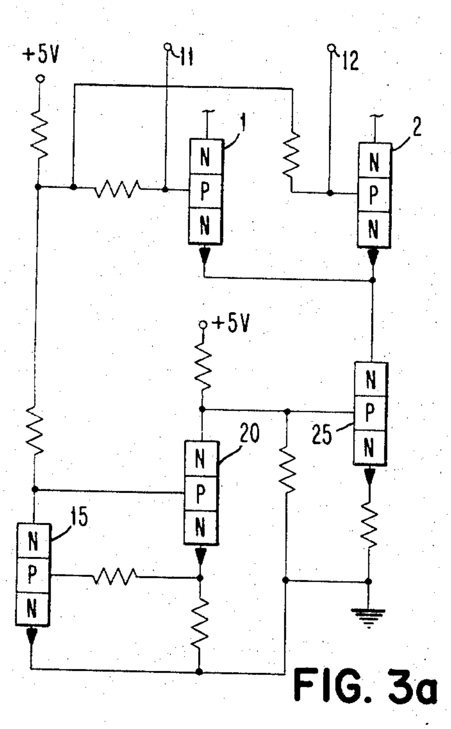
FIG. 3a
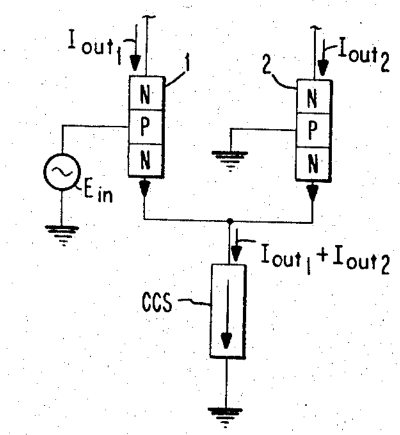
FIG. 2

United States Patent Office 3,419,810
Patented Dec. 31, 1968

3,419,810
TEMPERATURE COMPENSATED AMPLIFIER WITH AMPLITUDE DISCRIMINATION

Melvin P. Xylander, Apalachin, N.Y., assignor to International Business Machines Corporation, Armonk, N.Y., a corporation of New York
Filed Apr. 7, 1967, Ser. No. 629,125
1 Claim. (Cl. 330—23)

ABSTRACT OF THE DISCLOSURE

A differential amplifier having temperature compensating means for maintaining reasonably constant gain over a wide range of temperatures.

*Background of the invention*

One of the most serious difficulties encountered in small signal amplifiers has been the deleterious effects caused by temperature variations one solution of which involved an improved design requiring a variety of different source voltages. Yet other solutions employed innovations in design directed to components attached to improve the heat dissipation characteristics of monolithic structures as a means for improving stabiliy in amplifiers. The majority of these improvisations for improving amplifier stability have resulted in a decrease in volumetric efficiency and an increase in the production costs.

*Summary*

The present invention is directed to improving the stability of a small signal amplifier by selecting design parameters which vary with temperature changes at a rate which causes the gain of the amplifier to remain substantially constant. The amplifier comprises a difference amplifier for the first stage including temperature compensating means, a second stage of integration and amplification, and a threshold circuit connected to the output of the second stage.

The principal object of the invention is to provide an amplifier with a high degree of stability over a wide range of temperature variations.

It is another object to provide a more reliable differential amplifier by maintaining the gain of the amplifier substantially constant during variations in temperature.

Yet a more specific object is in an improved design for a differential amplifier wherein a minimum number of voltage sources are utilized to provide an increase in the volumetric efficiency in monolithic structures.

Still another object is to provide a highly reliable temperature compensated amplifier in monolithic structures by utilizing transistors having predetermined temperature characteristics in a novel design which yields substantially constant gain over a wide temperature range.

*Description of drawings*

FIG. 2 is an AC equivalent of the first stage of the amplifier including the temperature compensating current source.

FIG. 3*a* shows in detail the first stage of the amplifier and the temperature compensating means.

FIG. 3*b* shows a chart of circuit parameters for temperatures at −55° C., +25° C. and +125° C.

FIG. 3*c* shows steps for calculating gain at a temperature of −55° C.

*Description of preferred embodiment*

Figure 1:
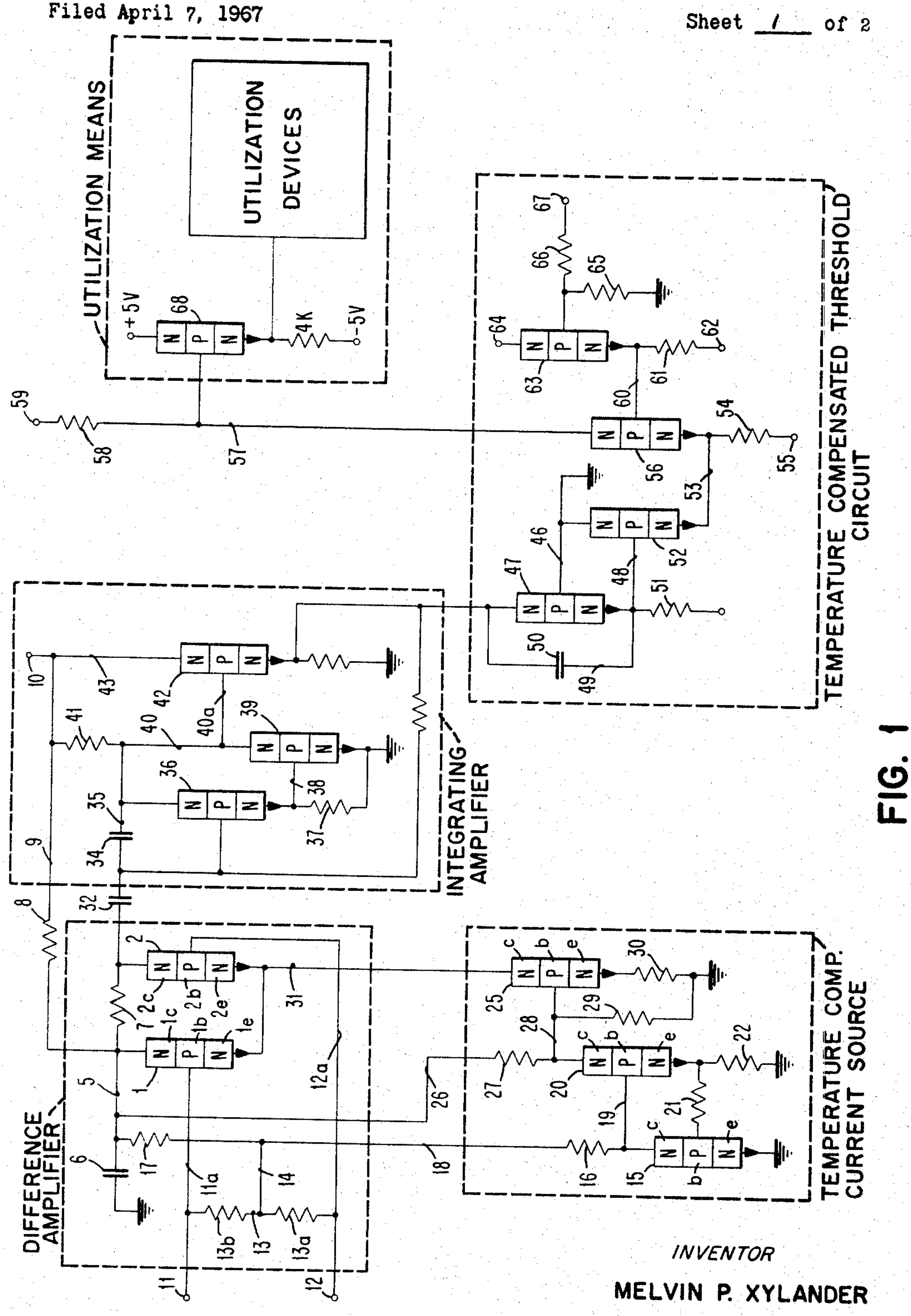
FIG. 1 is a detail circuit diagram showing the principal feature of the two stage amplifier.

Referring to FIG. 1, the first stage of the differential amplifier is constituted of transistors 1 and 2, each of the NPN type and each having collector, emitter and base electrodes respectively referenced 1*c*, 1*e*, 1*b* and 2*c*, 2*e*, 2*b*. The emitters 1*e* and 2*e* are coupled by way of a line 3. Collector 1*c* is connected to a ground potential via lines 4 and 5 and capacitor 6. Collector 2*c* is coupled to ground by way of capacitor 6, line 5 and resistor 7. The collectors 2*c* and 1*c* are also coupled to a +5 volt supply 10 by way of resistor 8 and a line 9. Base electrodes 1*b* and 2*b*, respectively, are connected to input terminals 11 and 12 by way of lines 11*a* and 12*a*, respectively. Resistors 13*a* and 13*b* are in a path 13 connected across the input terminals 11 and 12 and provide an input impedance of 200 ohms to a difference mode input signal.

The temperature compensating means comprises a network which includes transistors 15, 20 and 25 for producing a temperature compensated current source for the first stage. These transistors are each of the NPN type. Each of these transistors has an emitter, collector and base electrodes that are appropriately referenced. The transistor 15 has its collector 15*c* connected to the line 5 by way of a path 18 including resistors 16 and 17, and a further connection by way of a line 14 to the input impedance path 13. The collector 15*c* is also coupled to the base 20*b* by way of a path 19. The base 15*b* is connected by way of a resistive path 21 to the emitter 20*e*, the emitter path of which includes a resistor 22. The collector 20*c* is connected to the line 5 by way of a path 26, including resistor 27, and also to base 25*b* by way of a path 28 which is fed to ground by way of a rseistor 29. The grounded emitter path of transistor 25 includes a resistor 30. The collector 25*c* is connected by way of a path 31 to the emitter coupled first stage through which a temperature compensated current is fed to maintain a reasonably constant gain over a wide temperature range (−55° C. to +125° C.). The manner by which the present invention exercises control to maintain constant gain may be appreciated from the following:

The expression for transconductance gain $A_g$ of the difference amplifier is given as:

$$A_g=\frac{I_{out}}{E_{in}}=\left(\frac{1}{h_{ib_1}+h_{ib_2}}\right)\left(\frac{h}{h_{fe}+1}\right)$$

wherein $h_{fe}$ represents forward current gain of a common emitter configuration, and $h_{ib}$ represents input impedance of a common base configuration.

From this expression it can be appreciated that the effect of $h_{fe}$ on the gain is insignificant especially when $h_{fe}$ is large with respect to unity. The major control of the gain is predominately due to the values of $h_{ib_1}$ and $h_{ib_2}$. Where the sum of $h_{ib_1}$ and $h_{ib_2}$ is kept constant, the gain of the difference amplifier remains substantially constant. The value of $h_{ib}$ is a function of the physics of a transistor, and it is very nearly independent of the transistor type or material. The expression for $h_{ib}$, as may be found in numerous texts, is given as:

$$h_{ib}=\frac{KT}{qI_E}$$

wherein:

K=Boltzman's constant=$1.38\times10^{-23}$ joules/° Kelvin
$q$=Electronic charge=$1.60\times10^{-19}$ coulombs
T=Temperature in degrees Kelvin
$I_E$=Emitter current in amperes The values of K and $q$ are constant and the variables T and $I_E$ represent temperature and emitter current respectively.

The temperature is given in degrees Kelvin, and is referenced to absolute zero. Room temperature, for instance, is approximately 298° K. Small temperature changes have a small influence; however, over a military temperature range (218° K. to 398° K.) the influence is substantial. The emitter current ($I_E$), of course, has the greatest influence. If a means can be devised to control the emitter current as a function of temperature, the value of $h_{ib}$, and thus the gain, can be maintained relatively constant.

Transistors 15 and 20 are connected in a shunt feedback configuration whereby control of collector current in transistor 20 is influenced principally by the base-emitter voltage of transistor 15 and the 600 ohm resistor 22. Generally speaking, a characteristic of the base-emitter voltage of any silicon transistor is that it changes with temperature at a predictable rate very nearly equal to −2 mv. per degree centigrade. Unfortunately, this causes the collector current of transistor 20 to go in a direction opposite to that required to maintain a constant gain in the difference amplifier. The reversal of this undesirable characteristic is the function of transistor 25. By appropriate design, the collector current of transistor 25 can be controlled to vary with temperature at a rate which will cause the gain of the difference amplifier to remain substantially constant.

In the present embodiment, the current through transistor 25 is a direct function of temperature and varies at a rate that counteracts the change in $h_{ib}$ caused by temperature change. The result is that the gain of the difference amplifier remains essentially constant over the entire military temperature range.

The AC equivalent of the differential amplifier is shown, in FIG. 2, with the temperature compensated current source being shown as a rectangular block CCS, which represents the network including transistors 15, 20 and 25.

To illustrate the nature of the control imposed by the present invention, reference is invited to FIG. 3*a* which shows the differential amplifier, stage 1, and its temperature compensating circuit which includes the transistors 15, 20 and 25.

Under conditions where the temperature is at −55° C. (the equivalent of 218° K.) it will be seen, from an inspection of FIG. 3*a* and from the chart of FIG. 3*b* that the transconductance gain ($A_g$) is 0.0193 mho. At room temperature which is 25° C. (298° K.) the transconductance gain ($A_g$) is also 0.0193 mho. Thus for a substantially broad range of 80° C. the gain is constant. At an environment of +125° C. (398° K.), the extreme temperature of the military range, the transconductance gain ($A_g$) is 0.0183 mho.

In other words, over the entire military range the gain is, for all practical purposes, substantially constant and with only a maximum variation of .0010 mho.

The chart in FIG. 3*b* shows the variations in the various parameters, namely voltage at collector 20*c* of transistor 20, emitter voltage at emitter 25*e* of transistor 25, the collector current through transistor 25 and also the values for $h_{fe}$ and $h_{ib}$ for three illustrative temperatures of −55° C., +25° C. and +125° C.

A sample calculation for determining the gain and the value of $h_{ib}$ is shown in detail in FIG. 3*c*.

The second stage comprises a network including transistors 36, 39 and 42 each of the NPN type and each having collector, emitter and base electrodes appropriately referenced. The transistors 36 and 39 perform integration and amplification while transistor 42 provides DC stability, low output impedance, and maintains the transistors 36 and 39 well out of saturation range. The base 36*b* is connected to the output of the first stage by way of a path 33 which includes capacitor 32. The emitter 36*e* is grounded by way of a resistor 37 and is further coupled to the base 39*b* by way of a path 38. The collector of transistor 39 is connected to the +5 volt supply 10 by way of a path 40 containing resistor 41 and also a feedback path 35 containing a capacitor 34. The collector of transistor 39 is further connected by way of a path 40*a* to the base 42*b* of transistor 42 which serves to provide DC stabilization. The collector of transistor 42 is connected by way of path 43 to the +5 volt supply 10 and the emitter thereof is grounded by way of a resistor 44.

Transistors 36 and 39 serve as an integrating amplifier, the integration being achieved by negative feedback through the 40 pf. capacitor 34, and results in a gain which is inversely proportional to the frequency. At very low frequencies, the gain is extremely high and undesirable since shot noise and thermal noise generated within the transistor are amplified to a troublesome level. It is desirable, therefore, to "roll off" the gain at low frequencies. This is achieved by a secondary feedback path 45, containing resistor 46, connecting the emitter of transistor 48 to the base of transistor 36. This imposes a maximum limit on the gain of the amplifier and thus prevents the low frequency gain from exceeding a fixed value.

The gain of this stage is essentially controlled by the value of the 40 pf. capacitor 34 of a type which is substantially uninfluenced with temperature variations and thus assuring that the gain of this stage remains substantially constant over the entire military temperature range.

The output of the second stage is passed onto the threshold circuit which includes transistors 52 and 56 by way of a DC restore circuit which includes transistor 47 and capacitor 50. The latter transistor is of the NPN type having a collector, emitter and base electrode. The base is grounded whereas the collector is coupled to the emitter by way of a path 49 containing a capacitor 50. The emitter is further connected to a −5 volt supply by way of a resistor 51. The outputs of the circuit are connected by way of a path 48 to the base of transistor 52 whose collector is grounded and whose emitter is connected to the emitter of transistor 56 by way of a path 53. Both emitters are connected to a −5 volt supply 55 by way of a resistor 54. The collector of transistor 56 is connected to a +5 volt supply 59 by way of a path 57 and resistor 58. The base of transistor 56 is connected to the emitter of transistor 63 by way of a path 60 which is further connected to a −5 volt supply 62 through a resistor 61. Transistor 63 has its collector connected to a +5 volt supply 64 and its base to a divider network consisting of resistors 65 and 66 connected between ground and a +5 volt supply 67.

Transistor 47 and the 0.01 μf. capacitor 50 form a DC restore circuit. In standby condition, the emitter of transistor 47 is at DC voltage, below ground, equal to the base-emitter voltage. A positive going signal appearing at the emitter of transistor 42 is coupled through the 0.01 μf capacitor 50 to the emitter of 47 and also to the base of transistor 52. A positive going signal reverse biases transistor 47 and the signal is coupled to the base of 52 virtually uninhibited. Conversely, a negative going signal at the emitter of transistor 42 is coupled through the capacitor 50 to cause only an increase in the forward bias of transistor 47, thereby prohibiting an appreciable change in voltage and discharging capacitor 50. Thus, the reference level remains constant at the base of transistor 52 and only the positive going portion of the signal is allowed to ride above this reference level.

Transistors 52 and 56 constitute the basic threshold circuit. Normally, transistor 56 conducts all the current, because the base of transistor 63 is approximately 200 mv. above ground as controlled by the voltage dividing action of the 5K ohm resistor 66 and the 200 ohm resistor 65. The emitter voltage of transistor 63 will always track the emitter voltage of transistor 47 by a difference of 200 mv. over the entire military temperature range since in monolithic circuits the transistors are matched and thereby assume temperature compensation for the threshold circuit.

The threshold circuit switches in response to a positive going signal, exceeding 200 mv., appearing at the emitter of transistor 42, and, as a result, the collector of transistor 56 and the emitter of transistor 68 go positive, the latter being sufficient to control a utilization means having characteristics compatible with the circuits utilized in present day third generation type computers.

Although the illustrative embodiment in FIG. 1 employs an integrating amplifier as a means for interconnecting the differential amplifier to the threshold circuit, it is understood that any suitable means other than the integrating amplifier may be utilized for this purpose.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A differential amplifier comprising:

a transistorized configuration constituted of a pair of transistors, each possessing a predictable temperature characteristic, and each having matched small signal characteristics, each transistor further having base, emitter and collector electrodes, a current path connecting the emitters in common, a source of voltage connected to the collectors, a temperature compensated current source constituted of transistors having similar temperature predictable characteristics, whereby the gain of said amplifier is maintained substantially constant over a wide temperature range.

input terminals for applying an input signal to the base of each transistor, and said temperature compensated current source being connected to the emitter circuit path, said source having a characteristic which yields variations in current which are proportional to temperature variations at a rate which cancels out variations in the $h_{ib}$ characteristic due to temperature variations in said amplifier, and a temperature compensated threshold circuit comprising a pair of common emitter-connected transistors, a DC level setting transistor and a common collector transistor, said level setting transistor having its collector connected to the output of the differential amplifier and its common emitter connected to the base of one transistor of said pair of transistors, the common collector of the second transistor of said pair serving as the output, said common collector transistor having its emitter connected to the base of said second transistor; and a resistance divider network connected to the base of the common collector transistor to maintain the base thereof at a fixed potential during temperature variations thereby effecting mutual cancellation of the base emitter voltage changes in said pair of transistors and mutual cancellation of base emitter voltage changes in the common collector transistor and the DC level setting transistor.

References Cited

UNITED STATES PATENTS

| | | | |
|---|---|---|---|
| 3,290,520 | 12/1966 | Wennik | 330—69 X |
| 3,310,688 | 3/1967 | Ditkofsky | 330—69 X |
| 3,346,817 | 10/1967 | Walker et al. | 330—23 |

OTHER REFERENCES

Hart et al.: "Temperature Stable Constant Voltage Source," IBM Technical Disclosure Bulletin, p. 816; Oct. 5, 1965.

ROY LAKE, *Primary Examiner*

L. J. DAHL, *Assistant Examiner*.

U.S. Cl. X.R.

330—30, 69